United States Patent
Iwai et al.

(10) Patent No.: US 7,903,469 B2
(45) Date of Patent: Mar. 8, 2011

(54) NONVOLATILE SEMICONDUCTOR MEMORY, ITS READ METHOD AND A MEMORY CARD

(75) Inventors: Makoto Iwai, Yokohama (JP); Yoshihisa Watanabe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/838,510

(22) Filed: Aug. 14, 2007

(65) Prior Publication Data

US 2008/0049508 A1 Feb. 28, 2008

(30) Foreign Application Priority Data

Aug. 24, 2006 (JP) .................................. 2006-227254

(51) Int. Cl.
*G11C 16/26* (2006.01)

(52) U.S. Cl. ........... 365/185.25; 365/185.17; 365/185.18

(58) Field of Classification Search ............ 365/185.17, 365/185.18, 185.25
See application file for complete search history.

(56) References Cited

U.S. PATENT DOCUMENTS

| | | | |
|---|---|---|---|
| 5,862,074 A * | 1/1999 | Park ........................ | 365/185.03 |
| 2002/0159315 A1* | 10/2002 | Noguchi et al. .............. | 365/200 |
| 2005/0024974 A1* | 2/2005 | Noguchi et al. ......... | 365/230.03 |
| 2005/0047223 A1 | 3/2005 | Chen et al. | |
| 2005/0254302 A1* | 11/2005 | Noguchi .................. | 365/185.17 |
| 2006/0028870 A1* | 2/2006 | Roohparvar ............. | 365/185.17 |
| 2006/0072359 A1* | 4/2006 | Futatsuyama et al. ... | 365/185.17 |
| 2007/0133288 A1 | 6/2007 | Iwai et al. | |
| 2007/0140013 A1 | 6/2007 | Kwon et al. | |
| 2008/0101122 A1* | 5/2008 | Kang et al. ............... | 365/185.17 |

FOREIGN PATENT DOCUMENTS

| | | |
|---|---|---|
| JP | 2005-327409 | 11/2005 |
| JP | 2006-107577 | 4/2006 |
| KR | 2005-109835 | 11/2005 |

OTHER PUBLICATIONS

U.S. Appl. No. 12/621,913, filed Nov. 19, 2009, Watanabe.

* cited by examiner

*Primary Examiner* — Hoai V Ho
*Assistant Examiner* — Jay Radke
(74) *Attorney, Agent, or Firm* — Oblon, Spivak, McClelland, Maier & Neustadt, L.L.P.

(57) ABSTRACT

A nonvolatile semiconductor memory includes a memory cell array having a plurality of NAND cell units which are arranged with a plurality of memory cells connected in series and a first selection transistor and a second selection transistor which are each connected to both ends of the plurality of memory cells respectively, a plurality of word lines and a plurality of bit lines which are connected to the plurality of memory cells and a data read control part wherein at least one of the memory cells is selected and when data is read from that memory cell a read pass voltage is applied to a word line which is connected to a non-selected memory cell other than the selected memory cell, and after applying the read pass voltage a voltage is applied to a control gate of the first selection transistor or the second selection transistor, and when applying the read pass voltage, the read pass voltage which is applied to the word line which is connected to at least one of the non-selected memory cells which is adjacent to the first selection transistor or the second selection transistor, is made lower than the read pass voltage which is applied to the word line which is connected to another cell of the non-selected memory cells.

6 Claims, 11 Drawing Sheets

NONVOLATILE SEMICONDUCTOR MEMORY, ITS READ METHOD AND A MEMORY CARD

CROSS REFERENCE TO RELATED APPLICATION

This application is based upon and claims the benefit of priority from the prior Japanese Patent Application No. 2006-227254, filed on Aug. 24, 2006; the entire contents of which are incorporated herein by reference.

BACKGROUND OF THE INVENTION

1. Field of the Invention

The present invention relates to a nonvolatile semiconductor memory arranged with a memory cell array in which a plurality of electrically reprogrammable memory cells are placed in a matrix form, a method for reading this data and a memory card which is mounted on this type of nonvolatile semiconductor memory.

2. Description of the Related Art

Recently, the demand for small scale large capacity nonvolatile semiconductor memory has increased considerably. Among such devices, a NAND type flash memory which can realize high integration and large capacity when compared to conventional NOR type flash memories is drawing attention.

The NAND type flash memory is comprised of a memory cell array in which a plurality of NAND cell units are placed which are arranged with a plurality of memory cells which are connected in series in a form which shares a source and a drain, a drain side selection transistor which is connected to the drain side of this plurality of memory cells and a source side selection transistor which is connected to the source side of this plurality of memory cells.

In the memory cell array, a plurality of word lines are arranged in rows and a memory cell gate electrode is commonly connected in line in this word line direction. Also, each gate electrode of the source side selection transistors which are aligned in a word line direction, is commonly connected to/by a source side selection gate line. Also, a plurality of bit lines are arranged in rows in a direction which intersects the word line direction and each bit line is connected to a corresponding NAND cell unit via the drain side selection transistor. And, a voltage is applied and a plurality of word lines and a plurality of bit lines are selected and a data read-out control part performs a read-out of data in a plurality of memory cells.

Furthermore, in the case of reading data from a memory cell which is connected to the above stated word line, a nonvolatile semiconductor memory is proposed (for example, Japanese Laid Open Patent 2006-107577) which changes the signal supply order of the above stated source side selection gate line and the drain side selection gate line.

BRIEF SUMMARY OF THE INVENTION

The nonvolatile semiconductor memory relating to one embodiment of the present invention is arranged with a memory cell array which has a plurality of NAND memory cell units which are arranged with a plurality of memory cells connected in series, a first selection transistor and a second selection transistor which are connected to both ends of the plurality of memory cells respectively, and a plurality of word lines and a plurality of bit lines which are connected to the plurality of memory cells, when at least one memory cell is selected and data is read a read pass voltage is applied to the word line which is connected to a non-selected memory cell different from the selected memory cell and after applying the read pass voltage, a data read control part lowers the read pass voltage which is applied to the word line which is connected to at least one non-selected memory cell which adjoins the first selection transistor or second selection transistor lower than the read pass voltage which is applied to the word line which is connected to another non-selected memory cell.

The data read method of the nonvolatile semiconductor memory relating to one embodiment of the present invention is a data read method of the nonvolatile semiconductor memory including a NAND memory cell unit arranged with a plurality of memory cells connected in series, a first selection transistor and a second selection transistor which are connected to both ends of the plurality of memory cells respectively and a plurality of word lines and a bit line which is connected to the plurality of memory cells, and a memory cell array which includes a plurality of the NAND memory cell units, wherein when at least one memory cell is selected and data is read, a read pass voltage is applied to the word line which is connected to a plurality of non-selected memory cells different from the selected memory cell and after applying the read pass voltage, a voltage is applied to the first selection transistor or the second selection transistor, and when the read pass voltage is applied, the read pass voltage which is applied to the word line which is connected to at least one non-selected memory cell which adjoins the first selection transistor or the second selection transistor is reduced lower than the read pass voltage which is applied to the word line which is connected to another non-selected memory cell.

DETAILED DESCRIPTION OF THE INVENTION

Figure 1:
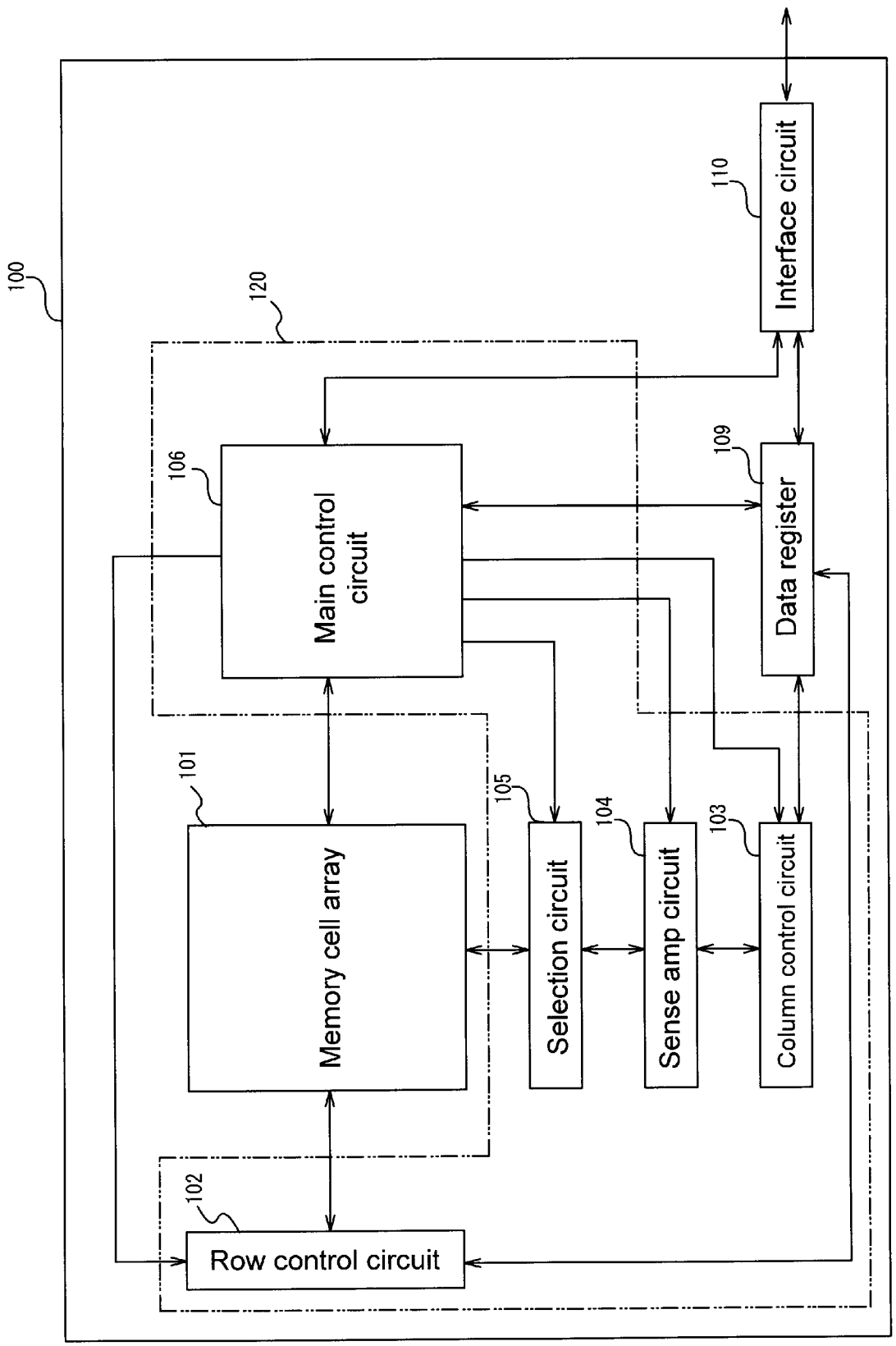
FIG. 1 is a block diagram which shows the composition of a nonvolatile semiconductor memory 100 relating to embodiment one of the present invention.

Below, a nonvolatile semiconductor memory relating to one embodiment of the present invention, its read method and a memory card which is mounted on this type of nonvolatile semiconductor memory will be explained in detail while referring to the drawings. Furthermore, in the embodiments below, an example of a nonvolatile semiconductor memory of the present invention, its read method and a memory card which is mounted on this type of nonvolatile semiconductor memory is shown. However, the nonvolatile semiconductor memory device of the present invention, its read method and a memory card which is mounted on this type of nonvolatile semiconductor memory of the present invention is not limited to those examples.

Embodiment One

FIG. 1 is a block drawing which shows the composition of a nonvolatile semiconductor memory device 100 relating to embodiment one. As is shown in FIG. 1, the nonvolatile semiconductor memory device 100 relating to embodiment one is arranged with a memory cell array 101, a row control circuit 102, a column control circuit 103, a sense amp circuit 104, a selection circuit 105, a main control circuit 106, a data register 109 and an interface circuit 110.

The interface circuit 110 carries out the sending and receiving of data and control signals (command and clock signals) with an external device. The interface circuit 110 receives a data or control signal from the external device and after a predetermined treatment provides the signal to the main control circuit 106 and the data register 109.

The main control circuit 106 controls the row control circuit 102, the column control circuit 103, the sense amp circuit 104, the selection circuit 105 and the data register 109 based on a control signal from interface circuit 110.

The main control circuit 106 provides access data to a memory cell of the memory cell array 101 to the row control circuit 102 and the column control circuit 103. The row control circuit 102 and the column control circuit 103 controls the sense amp circuit 104 and the selection circuit 105 based on the access data and data, reads the data from the memory cell and performs programming or erasure.

The sense amp circuit 104 includes a plurality of sense amp circuits and is connected to a bit line of the memory cell array 101 via the selection circuit 105, provides data to the bit line, detects the bit line voltage and retains the data in a data cache. The main control circuit 106 provides the data which is read from a memory cell by the sense amp circuit 104 which is controlled by the column control circuit 103 to an external device via the data register 109 and the interface circuit 110. The selection circuit 105 carries out a selection of a data cache which is connected to a bit line among the plurality of data caches which comprise the sense amp circuit 104.

In addition, in the nonvolatile semiconductor memory 100 of embodiment one the read control part 120 is composed of the row control circuit 102, the column control circuit 103, the sense amp circuit 104, the selection circuit 105 and the main control circuit 106. The read control part 120 applies a voltage to a word line and a bit line when data is read from a memory cell.

Next, one example of the memory cell array 101 of the nonvolatile semiconductor memory 100 relating to embodiment one will be explained in detail while referring to the drawings.

Figure 2:
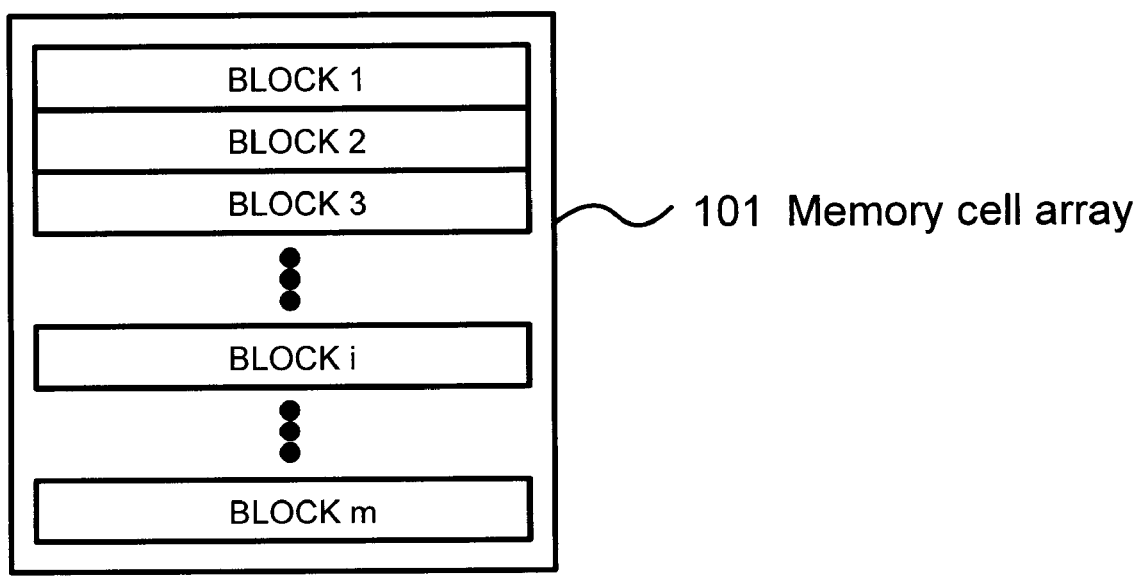
FIG. 2 is a block diagram which shows one example of a memory cell array 101 relating to embodiment one of the present invention.

FIG. 2 is a block diagram which shows one example of the memory cell array 101 of embodiment one. As is shown in FIG. 2, the memory cell array 101 of embodiment one is arranged with m number of blocks BLOCK1, BLOCK2, BLOCK3, . . . , BLOCKi . . . , BLOCKm which are divided. Here, a block is the smallest unit in which data is erased at one time. The blocks BLOCK1, BLOCK2, BLOCK3, . . . , BLOCKi . . . , BLOCKm have the same construction.

Figure 3:
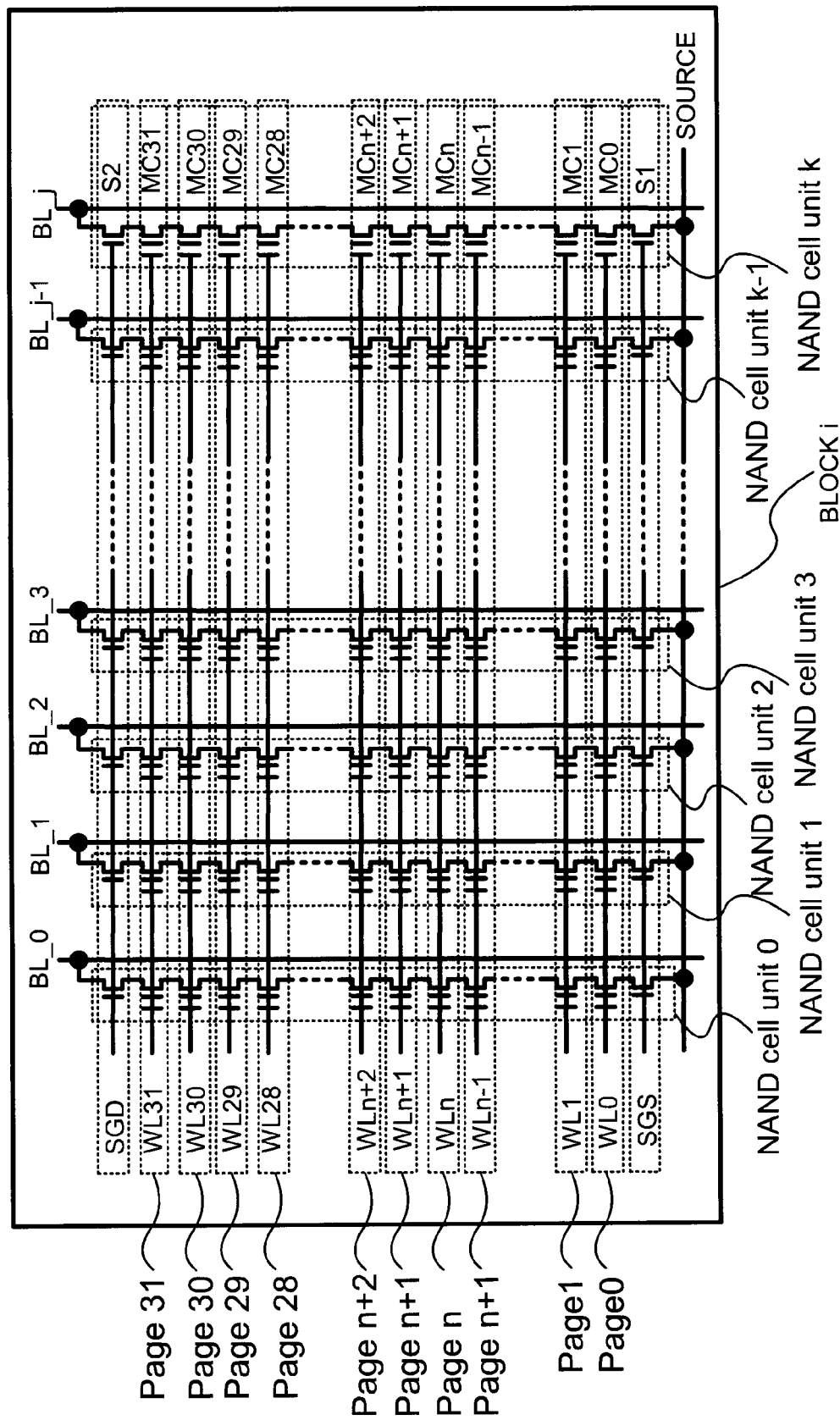
FIG. 3 is a circuit diagram which shows one example of the composition of one block BLOCKi of the memory cell array 101 relating to embodiment one of the present invention.

FIG. 3 is a circuit diagram which shows the construction of one block BLOCKi of the memory cell array 101 of embodiment one. In the memory cell array 101 of embodiment one, each block BLOCK0-BLOCKm is composed of (k+1) number of NAND cell units 0-k, similar to the block BLOCKi which is representatively shown in FIG. 3. Also, each NAND cell unit is constructed so that thirty-two (32) memory cells MC0-MC31 are connected in series in a form where they share the source/drain region. One end of the region is connected to a bit line BL (BL_0, BL_1, . . . , BL_i, . . . , BL_j−1, . . . , BL_j) via a selection gate transistor S2 which is connected to a selection gate line SGD and the other end is connected to a common source line SOURCE via a selection gate transistor S1 which is connected to a selection gate line SGS. By this type of construction a voltage path is formed from a bit line BL, passing through the drain side selection transistor S2, memory cell MC31, . . . , memory cell MC0, the source side selection transistor S1 up to the common source line SOURCE. In addition, the control gate of each memory cell MC is connected to a word line WL (WL0-WL31). (k+1) number of memory cells which are each connected to one word line WL, stores one bit of data and these (k+1) number of memory cells MC comprise a unit called a page.

Figure 4:
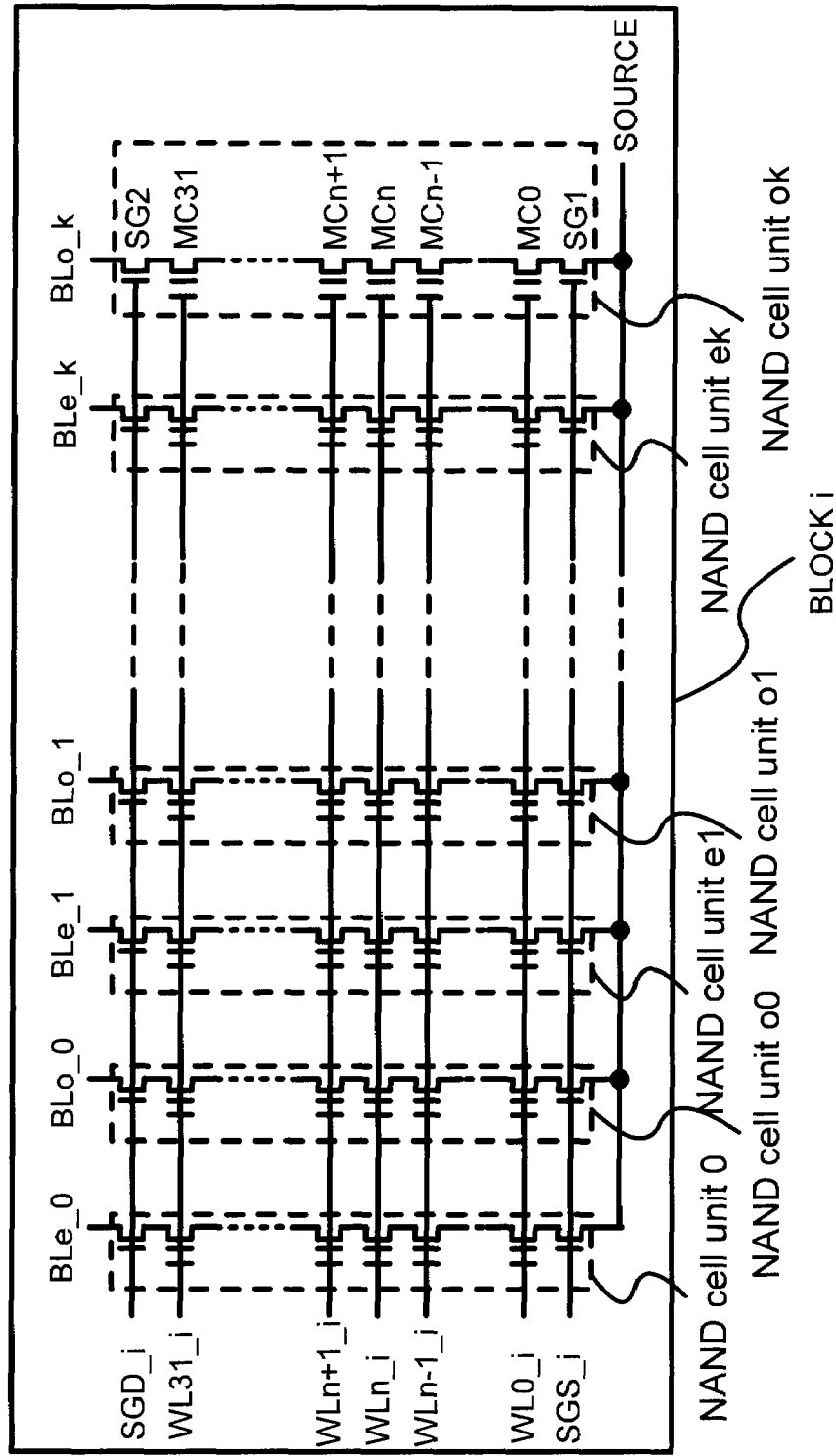
FIG. 4 is a circuit diagram which shows one example of the composition of one block BLOCKi of the memory cell array 101 relating to embodiment one of the present invention.

Also, in embodiment one, the number of blocks which comprise a memory cell array is given as m, one block is given to include (k+1) number of NAND cell units which have thirty-two (32) memory cells. However, the present invention is not limited to these numbers: the number of blocks, the number of memory cells MC and the number of NAND cell units may be changed according to desired capacity. Also, in embodiment one, each memory cell MC is given as storing one bit of data, however, each memory cell may be made to store a plurality of bit data (multi-value bit data) corresponding to the amount of electron injection. In addition, in embodiment one, an example of a nonvolatile semiconductor memory in which one NAND cell unit is connected to one bit line BL is explained, however, as is shown in FIG. 4, the nonvolatile semiconductor memory 100 of the present invention may be applied to a Shared Bit Line type nonvolatile semiconductor memory in which a plurality of NAND cell units share one bit line BL.

Each control gate of the memory cells MC0-MC31 of embodiment one is connected to a word line WL (WL0-WL31). The bit lines BL_0, BL_1, . . . , BL_i, . . . , BL_j−1, BL_j each independently perform data programming and data reading. Each of (k+1) number of memory cells MC store one bit of data. These (k+1) number of memory cells MC compose a unit called a page.

The sense amp circuit 104 is arranged with a plurality of sense amp circuits 1041 which are not shown in the drawings. Each sense amp circuit of the plurality of sense amp circuits 1041 is selectively connected to any one of the bit lines BL_0, BL_1, . . . , BL_i, . . . , BL_j−1, BL_j via the selection circuit 105. This sense amp circuit 1041 is called a bit line shield type sense amp circuit.

The selection circuit 105 selects one bit line based on selection data and is connected to the sense amp circuit 1041 which is not shown in the drawings and is not connected to the sense amp circuit 1041 when the other bit lines are non-selected. In this case, the selection circuit 105 connects a non-selected bit line to ground when data is read and by this, the coupling noise between an adjacent bit line is reduced. In addition, the selection circuit 105 applies a voltage VDD to the non-selected bit line during a program operation so that data cannot be programmed to the memory cell MC.

In addition, in the nonvolatile semiconductor memory 100 of embodiment one the read control part 120 is composed of the row control circuit 102, the column control circuit 103, the sense amp circuit 104, the selection circuit 105 and the main control circuit 106. The read control part 120 applies a voltage to a word line and a bit line when data is read from a memory cell.

Further, the nonvolatile semiconductor memory of the present invention is not limited to embodiment one shown in the drawings. The number of blocks, the number of NAND cell units and the number of memory cells may be changed according to necessity. Also, although each memory cell MC in the nonvolatile semiconductor memory of embodiment one is made to store one bit of data, each memory cell MC may be made to store a plurality of data bits (multi-value bit data) according to the amount of electron injection.

Figure 10:
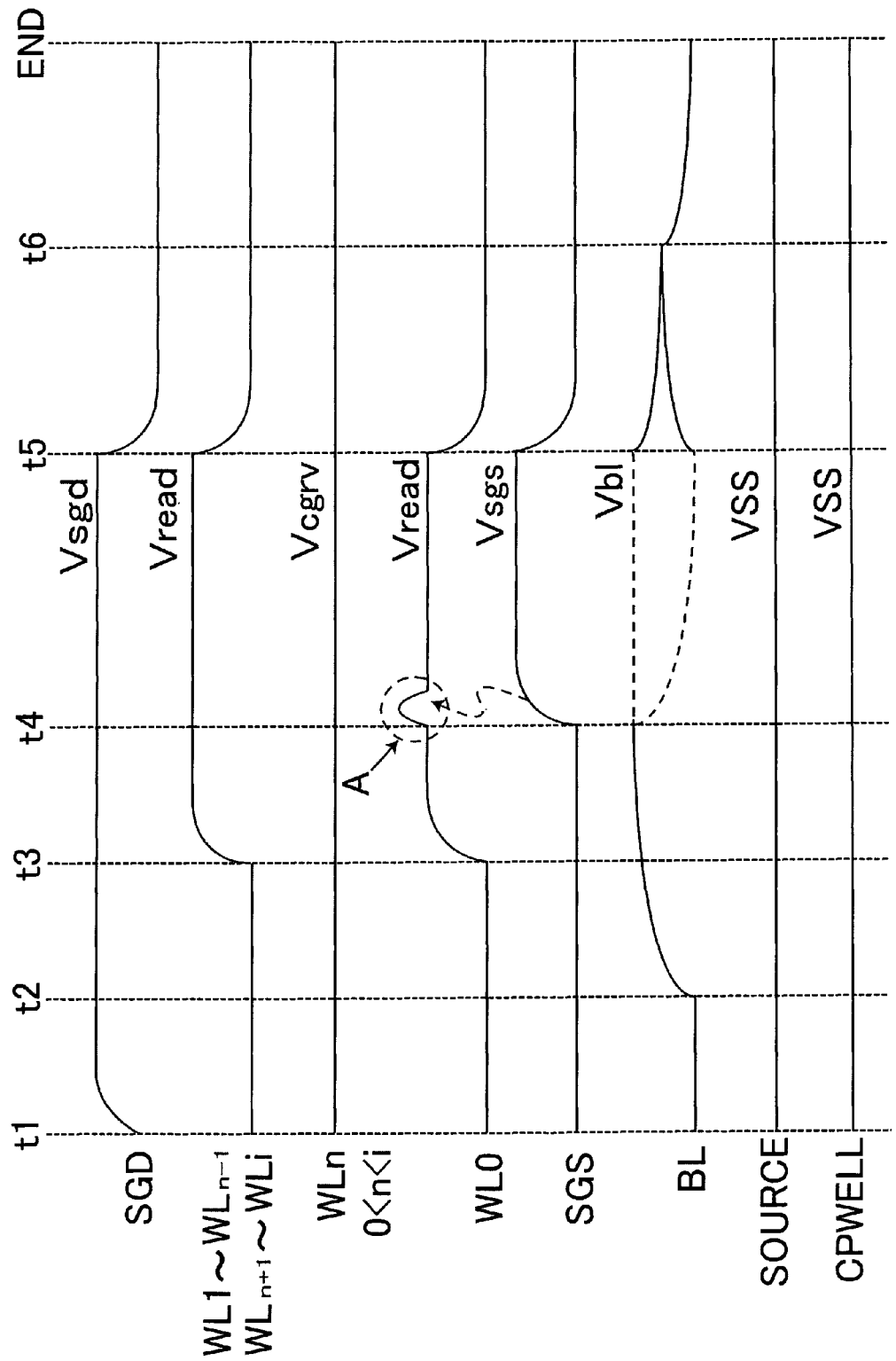
FIG. 10 is a general operation timing chart when the data of a memory cell relating to an embodiment of the present invention is read.

Next, the general operation in the case of memory cell data read in the nonvolatile semiconductor memory 100 of embodiment one will be explained while referring to FIG. 10. FIG. 10 is a timing chart of a general operation in the case of memory cell data read. First, at the timing t1, the data read control part 120 applies a voltage Vsgd (for example, a voltage of about 4V) to the drain side selection gate line SGD. Next, at the timing t2, the data read control part 120 applies a voltage Vbl (for example, a voltage of about 1V) to a bit line BL. Next, at the timing t3, the data read control part 120 applies a predetermined voltage to the word lines WL0-WLi. That is, a read voltage Vcgrv (for example, a voltage of about 0V) is applied to a word line WLn (selected word line) which is connected to the memory cell from which data is read (selected memory cell), and a read pass voltage Vread (for example, a voltage of about 5V) is applied to all other word lines (non-selected word line). Next, at the timing t4, the data read control part 120 applies a voltage Vsgs (for example, a voltage of about 4V) to the source side selection gate line SGS. Also, during this series of read operations, the data read control part 120 applies a ground voltage VSS to a common source line SOURCE and a well CPWELL.

The data read control part 120 applies this type of voltage to each wire and makes a selected memory cell and a non-selected memory cell which is connected to a non-selected word line turn ON. By detecting a voltage change which occurs in the bit line at this time, the sense amp circuit judges whether a "0" data or a "1" data is stored in the memory cell which should be read. More specifically, for example, when electrons are injected into a floating gate, the state where the threshold of a memory cell becomes high may be defined as "0" data. Alternatively, when electrons are removed from a floating gate, the state where the threshold of a memory cell becomes low may be defined as "1" data.

During the read operation stated above, when the source side selection gate line SGS is charged, as shown by the arrow A in FIG. 10, the non-selected word line WL0 receives a coupling noise from the source side selection gate line SGS and an overshoot voltage may occur. As a result of this overshoot voltage, a voltage difference may become large between the substrate (well CPWELL) and the non-selected word line WL0 and the memory cell MC0 which is connected to the non-selected word line WL0 becomes a state where programming is weak. Because of this, during a read operation, the threshold voltage of the memory cell MC0 is boosted and what is known as read disturb may occur.

As the miniaturization of semiconductor memories progresses, while low resistance gate wire material used in word lines or selection gate lines SGS and SGD is being demanded and thinning becoming more difficult, the space between gate wires is becoming narrower and the coupling noise between gate wires is becoming greater. Also, from the viewpoint of memory cell MC reliability and durability, thinning of a memory cell MC tunnel insulation layer is becoming more difficult and the proportion of the capacity of the word lines and selection gate lines SGS taken up the capacity between the wires is increasing. As a result, coupling noise between the gate wires is becoming greater and greater, it is more difficult to reduce the influence of an overshoot voltage caused by this coupling noise and avoid the generation of a read disturb, and it is becoming more and more difficult to realize a semiconductor memory with high reliability.

Figure 11:
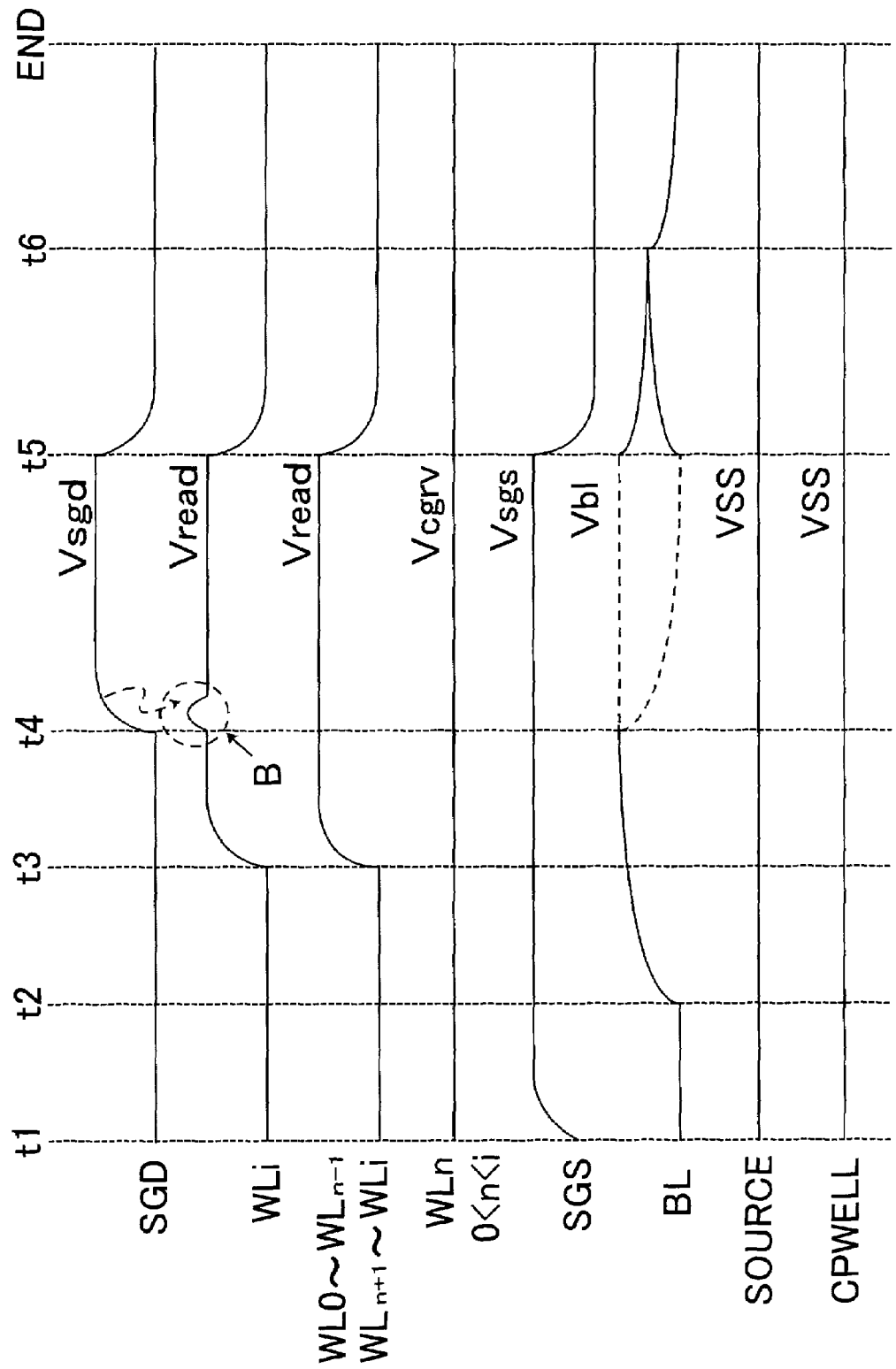
FIG. 11 is an operation timing chart when the data of a memory cell is read using the technology of patent document 1.

In order to reduce the influence of an overshoot voltage caused by the coupling noise stated above, technology such as that explained below is disclosed in the above stated patent document 1. FIG. 11 will be referred to. FIG. 11 is a timing chart of an operation in the case of data read of a memory cell MCn using the technology in patent document 1.

Apart from when changing the order in which the drain side selection gate line SGD and the source side selection gate line SGS are charged, the read operation in FIG. 11 and FIG. 10 are the same. That is, as is shown in FIG. 11, at the timing t1, the data read control part 120 applies a voltage Vsgs (for example, about 4V) to the source side selection gate line SGS. At the timing t4, the data read control part 120 applies a voltage Vsgd (for example, about 4V) to the drain side selection gate line SGD. According to this, at the timing t4 when the read operation is started, it is possible to prevent an overshoot voltage and a read disturb which accompanies it because the non-selected word line WL0 does not receive any coupling noise influence from the selection gate line SGD.

However, even by this technology, at the timing t4, when the drain side selection gate line SGD is charged, as is shown by the arrow B in FIG. 11, there is a possibility that the non-selected word line WLi receives a coupling noise from the adjacent drain side selection gate line SGD and an overshoot voltage may occur It is possible to avoid the generation of an overshoot voltage caused by a coupling noise which occurs between this type of selection gate line SGS and SGD and adjacent non-selected word lines WL0, WLi by delaying the charge speed of the selection gate lines SGD and SGS. However, if the charge speed of the selection gate lines SGD and SGS is delayed, the speed of a data read operation becomes slow and because this goes against recent demands for high speed performance, it cannot be said that this is an effective solution method.

Consequently, according to embodiment one, a technology which improves the speed of a data read operation, reduces an overshoot peak voltage value which occurs by receiving a coupling noise from a selection gate line, and prevents read disturb by applying a read pass voltage to a non-selected word line which is adjacent to a selected gate line which is charged after the selection gate lines SGD, SGS which is lower than the read pass voltage applied to other non-selected word lines, will be explained.

Figure 5:
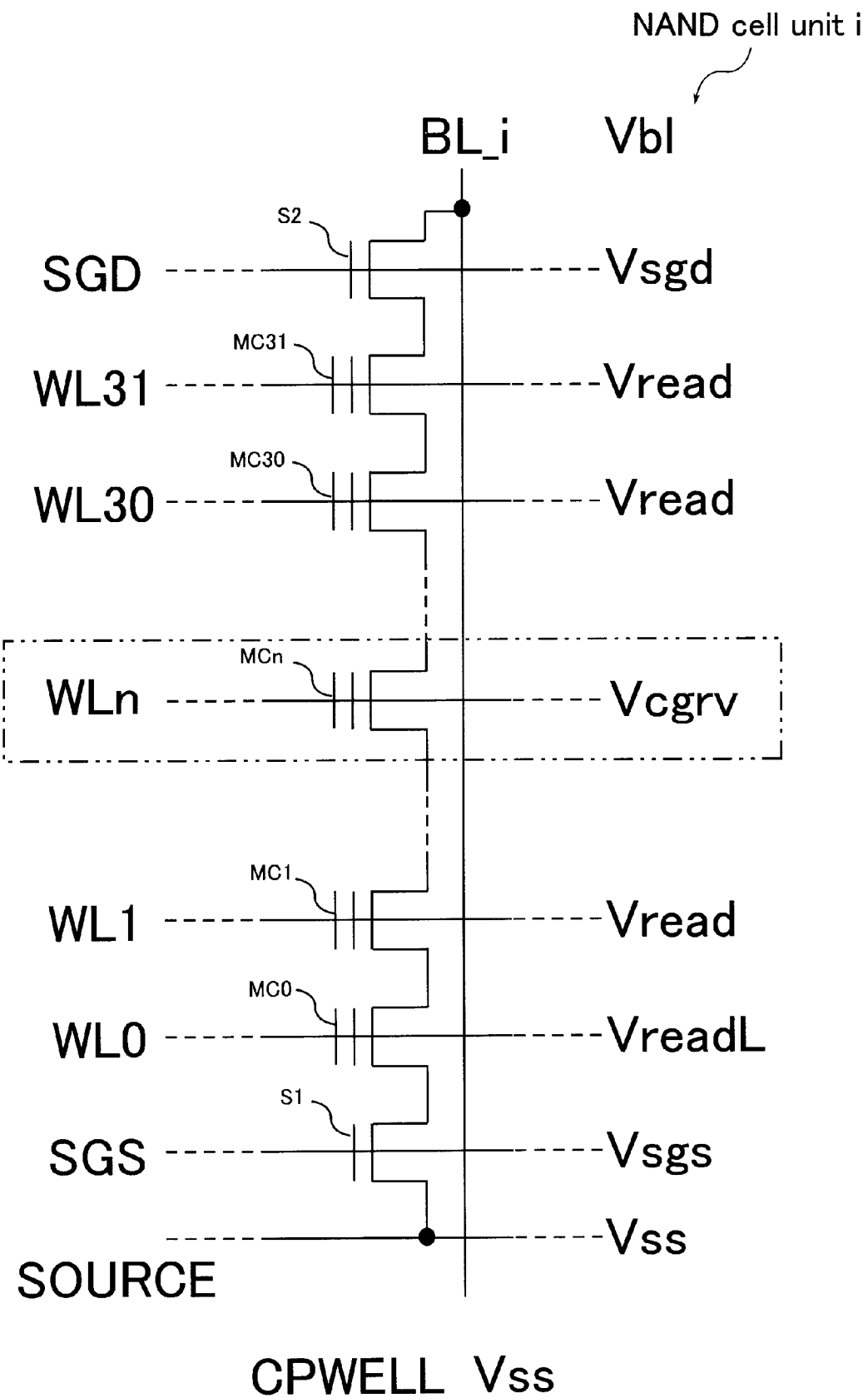
FIG. 5 is a circuit diagram which shows the composition of one memory cell unit of the BLOCKi relating to embodiment one of the present invention.

Next, an operation which reduces a peak overshoot voltage value during data read from a memory cell in the nonvolatile semiconductor memory 100 of embodiment one will be explained while referring to FIG. 5 and FIG. 6. FIG. 5 is a circuit diagram which shows the construction of one NAND cell unit i within the block BLOCKi. Also, FIG. 6 is a timing chart of an operation during data read from a memory cell MCn.

Figure 6:
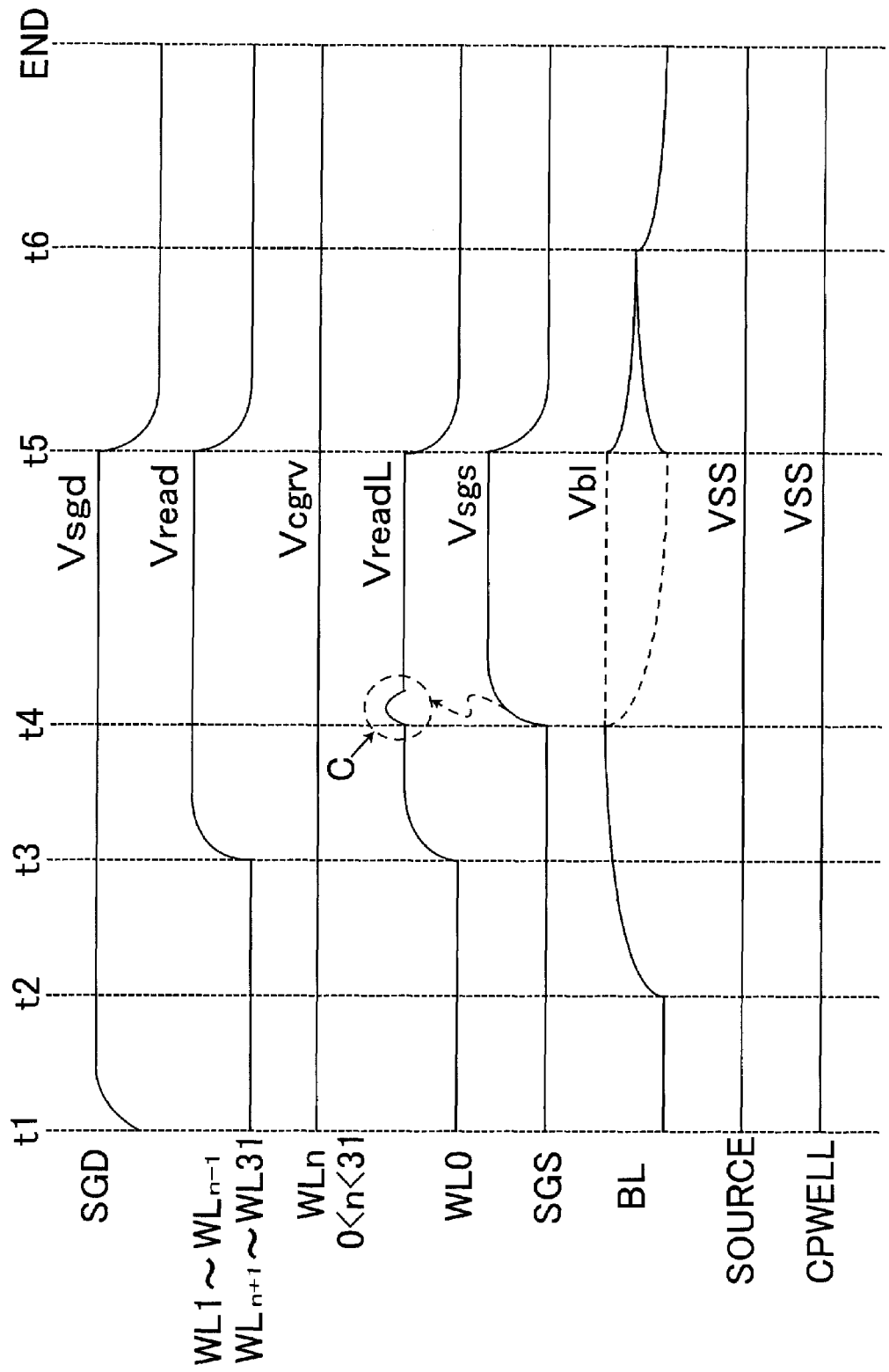
FIG. 6 is an operation timing chart when data is read from a memory cell MCn relating to one embodiment one of the present invention.

As is shown in FIG. 6, in the nonvolatile semiconductor memory 100, first, at the timing t1 the data read control part 120 applies a voltage Vsgd (for example, a voltage of about 4V) to the drain side selection gate line SGD. Next, at the timing t2 the data read control part 120 applies a voltage Vbl (for example, a voltage of about 1V) to the bit line BL0.

Next, at the timing t3 the data read control part 120 applies a predetermined voltage to the word lines WL0-WL31. More specifically, the data read control part 120 applies a read voltage Vcgrv (for example, a voltage of about 0V) to the selected word line WLn which is connected to the memory cell MCn which should be read, applies a read pass voltage VreadL (for example, a voltage of about 4.5V) to the non-selected word line WL0 which is adjacent to the source side selection gate line SGS and applies a read pass voltage Vread (for example, a voltage of about 5V) to the other non-selected word lines WL1-WLn−1 and WLn+1-WL31.

The read pass voltage VreadL is set lower than the read pass voltage Vread. That is, the read pass voltage VreadL is set at a minimum to sufficiently secure a cell current, specifically, it is set at 0.1-0.5V lower than the read pass voltage Vread.

Next, at the timing t4, the data read control part 120 applies a voltage Vsgs (for example, a voltage of about 4V) to the source side selection gate line SGS.

At the timing t4, when the source side selection gate line SGS is charged, a coupling noise is received in the non-selected word line WL0 and as shown by the arrow C in FIG. 6, an overshoot voltage occurs. However, because a low read pass voltage VreadL is applied in advance to the non-selected word line WL0 in embodiment one, the overshoot voltage peak value is reduced and it is possible to prevent the generation of read disturb. Specifically, when a read pass voltage Vread (for example, about 5V) is applied to the non-selected word line WL0, the overshoot voltage peak value rises to about 5.5V and the threshold voltage of the memory cell MC0 which is connected to the non-selected word line WL0 rises. To this phenomenon, a read pass voltage VreadL (for example, about 4.5V) lower than the read pass voltage Vread is applied to the non-selected word line WL0 in embodiment one and it becomes possible to suppress an overshoot voltage peak value to about 5V.

Also, in the nonvolatile semiconductor memory 100 of embodiment one, because it is possible to hasten the charge speed of the source side selection gate line SGS which is to be charged later, it becomes possible to improve the data read speed of a memory cell MC.

After the data read control part 120 applies a voltage such as that described above, the data which is stored in a memory cell MC is read. That is, in a nonvolatile memory cell MC, for example, electrons are injected into a floating gate of a memory cell MC and the state when the threshold value of the memory cell MC is high is defined as "0" data and when electrons are removed from the floating gate, the state when the threshold value of the memory cell MC is low is defined as "1" data. Therefore, when a desired read voltage Vcgrv is applied to a selected word line, if the memory cell MC to be read is "1" data, a voltage is conducted to a common source line SOURCE from a bit line BL in that NAND cell unit and the bit line BL voltage become low. If the memory cell MC to be read is "0" data, a voltage is not conducted in that NAND cell unit and the bit line BL voltage does not become low. In this way, because the bit line BL voltage changes according to the cell data it is possible to read the data of a memory cell by whether the voltage of a bit line BL is has become low or not.

Further, in the timing chart shown in FIG. 6, because a read pass voltage Vread is applied to the non-selected word line WL31 which is adjacent to the drain side selection gate line SGD after the drain side selection gate line SGD has been charged, an overshoot voltage which has received coupling noise does not occur. As a result, there is no need to apply a read pass voltage Vread to the non-selected word line WL31 which is adjacent to the drain side selection gate line SGD.

After the data read control part 120 has finished reading the data, at the timing t5, the voltage of the drain side selection gate line SGD, the word lines WL0-WL31 and the source side selection gate line SGS are discharged to 0V while all the bit lines BL0-BLj are shorted. Next, the data read control part 120 discharges all the bit lines BL0-BLj which have become the same voltage 0V at the timing t6.

Further, with the progress in miniaturization processing technology, it is possible that not only the word line WL0, which is adjacent to the source side selection gate line SGS, but also two word lines WL1 receive the influence of coupling noise from the source side selection gate line SGS. In this case, VreadL may be applied not only to the adjacent word line WL0 but also to the two word lines WL1.

Furthermore, when a read pass voltage VreadL is applied to the non-selected word line WL0 which is adjacent to the source side selection gate line SGS, the source side selection gate line SGS may be charged after the drain side selection gate line SGD has been charged. It is possible to optionally change the charge order of other lines.

As explained above, according to the nonvolatile semiconductor memory 100 relating to embodiment one, the non-selected word line WL0 receives a coupling noise with charging of the source side selection gate line SGS and the overshoot voltage peak value is reduced. By this, it becomes possible to prevent a read disturb of the memory cell MC0 which is connected to the non-selected word line WL0. Also, because it is possible to hasten the charge speed of a selection gate line, it becomes possible to improve the data read speed of a memory cell.

Embodiment Two

In embodiment one, the data read operation was explained whereby it is made possible to prevent a read disturb by a reduction of an overshoot voltage peak value, which is generated by a coupling noise received from the source side selection gate line SGS among the selection gate lines SGD, SGS, in the non-selected word line WL0 which is adjacent to the source side selection gate line SGS which is charged later. In embodiment two, the data read operation whereby it is made possible to prevent a read disturb by a reduction of an overshoot voltage peak value, which is generated by a coupling noise received from the drain side selection gate line SGD among the selection gate lines SGD, SGS, in the selected word line WL31 which is adjacent to the drain side selection gate line SGD which is charged later will be explained in detail while referring to the drawings.

Because FIG. 1 which is a block diagram which shows the construction of a nonvolatile semiconductor memory 100, FIG. 2 which is a block diagram which shows one example of a memory cell array 101 and FIG. 3 and FIG. 4 which are circuit drawings which show one example construction of one block BLOCKi of the memory cell array 101 are the same as in embodiment one, their explanation will be abbreviated in embodiment two.

Figure 7:
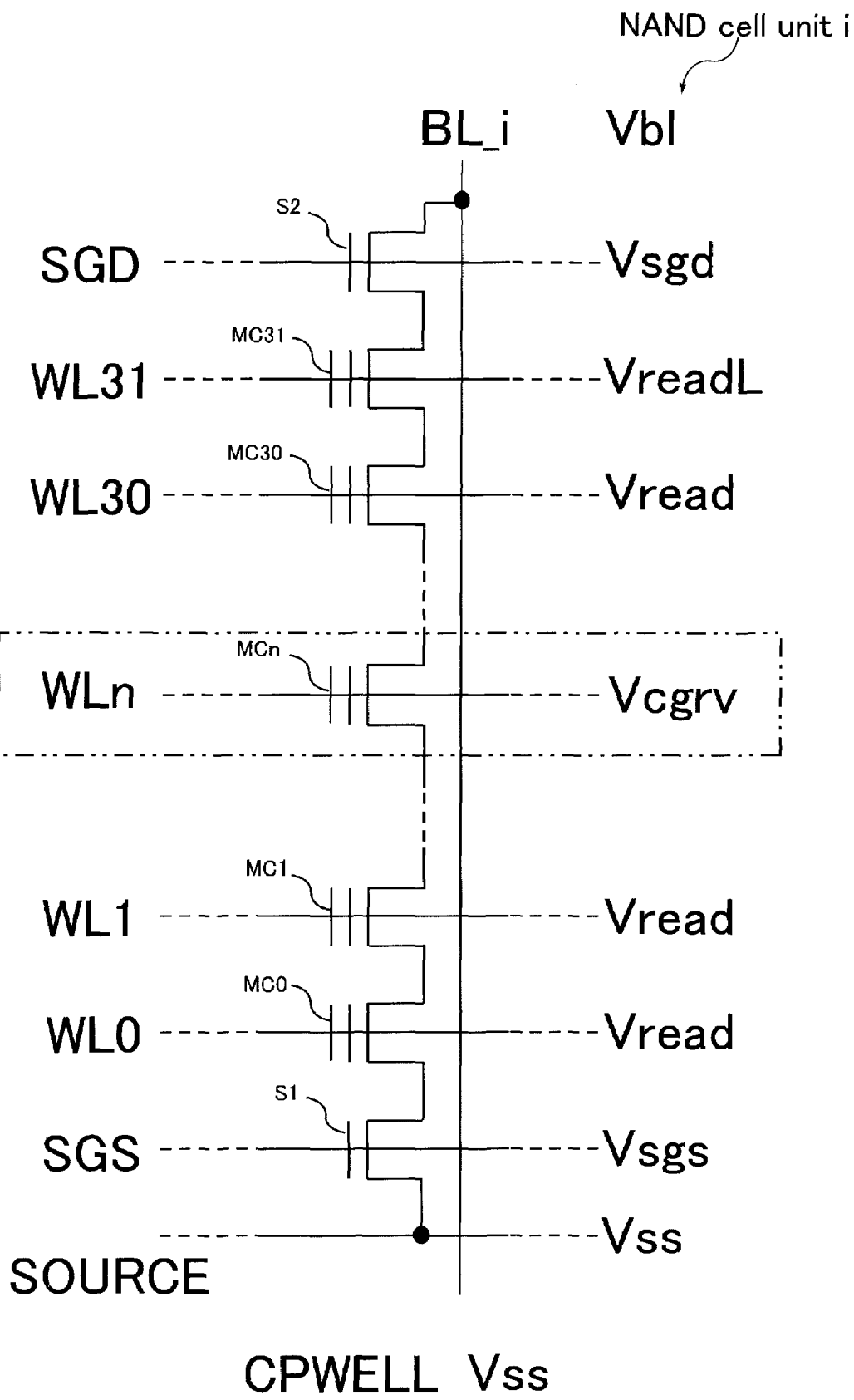
FIG. 7 is a circuit diagram which shows the composition of one memory cell unit of the block BLOCKi relating to embodiment two of the present invention.
Figure 8:
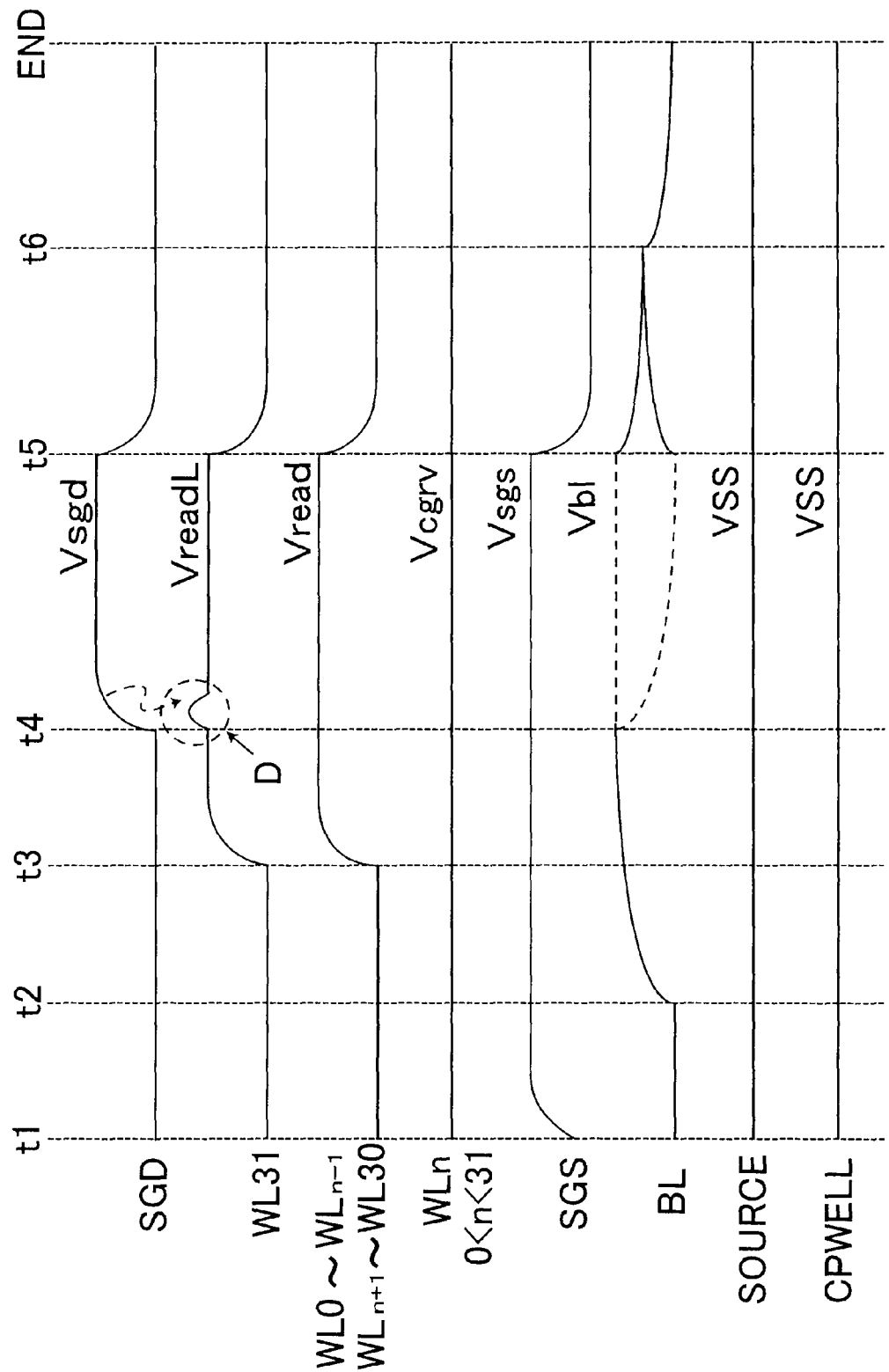
FIG. 8 is an operation timing chart when data is read from a memory cell MCn relating to one embodiment two of the present invention.

FIG. 7 and FIG. 8 will be explained. FIG. 7 is a circuit drawing which shows a construction of one NAND cell unit i within a block BLOCKi in the nonvolatile semiconductor memory 100 in embodiment two. Also, FIG. 8 is a drawing which shows by a timing chart the operation in the case of data read of a memory cell MCn in embodiment two.

Apart from whether a read pass voltage, which is applied to WL0 and WL31, is Vread or VreadL, FIG. 7 and FIG. 5 are the same. Apart from whether the charge speed of the source side selection gate line SGS and the drain side selection gate line SGD is different and whether the non-selected word line which is applied with a read pass voltage VreadL is the word line WL31, FIG. 8 and FIG. 6 are the same regarding the basic timing of applying a voltage.

That is, as is shown in FIG. 8, in the nonvolatile semiconductor memory 100 in embodiment two, first, at the timing t1, the data read control part 120 applies a voltage Vsgs (for example, a voltage of about 4V) to the source side selection gate line SGS. Next, at the timing t2, the data read control part 120 applies a voltage Vb1 (for example, a voltage of about 1V) to the bit line BL0.

Next, at the timing t3, the read control part 120 applies a predetermined voltage to the word lines WL0-WLi. Specifically, the read control part 120 applies a read voltage Vcgrv (for example, a voltage of about 0V) to the selected word line WLn which is connected to the memory cell MCn which should be read, applies a read pass voltage VreadL (for example, a voltage of about 4.5V) to the non-selected word line WL31 which is adjacent to the drain side selection gate line SGD and applies a read pass voltage Vread (for example, a voltage of about 5V) to the other non-selected word lines WL0 WLn−1 and WLn+1-WL30.

The read pass voltage VreadL in embodiment two is set lower than the read pass voltage Vread, the same as in embodiment one. That is, the read pass voltage VreadL is set at a minimum voltage to sufficiently secure a cell current, specifically, it is set about 0.1-0.5V lower than the read pass voltage Vread.

Next, at the timing t4, the data read control part 120 applies a voltage Vsgd (for example, a voltage of about 5V) to the drain side selection gate line SGD.

At the timing t4, when the drain side selection gate line SGD is charged, a coupling noise is received in the non-selected word line WL31 and as shown by the arrow D in FIG. 8, an overshoot voltage occurs. However, because a low read pass voltage VreadL is applied in advance to the non-selected word line WL31 in embodiment two, the overshoot voltage peak value is reduced and it is possible to prevent the generation of read disturb. Specifically, when a read pass voltage Vread (for example, about 5V) is applied to the non-selected word line WL31, the overshoot voltage peak value rises to about 5.5V and the threshold voltage of the memory cell which is connected to the non-selected word line WL31 rises. To this phenomenon, a read pass voltage VreadL (for example, about 4.5V) lower than the read pass voltage Vread is applied to the non-selected word line WL31 in embodiment two and it becomes possible to suppress an overshoot voltage peak value to about 5V.

Also, in the nonvolatile semiconductor memory 100 of embodiment two, because it is possible to hasten the charge speed of the drain side selection gate line SGD which is to be charged later, it becomes possible to improve the data read speed of a memory cell MC.

Further, in the timing chart shown in FIG. 8, because a read pass voltage Vread is applied to the non-selected word line WL0 which is adjacent to the source side selection gate line SGS after the source side selection gate line SGS has been charged, an overshoot voltage which has received coupling noise does not occur. As a result, the data read control part 120 in embodiment two does not need to apply a read pass voltage Vread to the non-selected word line WL0 which is adjacent to the source side selection gate line SGS.

Because the operations of the timings after t5 are the same as in embodiment one their explanation will be abbreviated in embodiment two.

Further, also in embodiment two, with the progress in miniaturization processing technology, it is possible that not only the word line WL31, which is adjacent to the drain side selection gate line SGD, but also two word lines WL30 and WL31 receive the influence of coupling noise from the source side selection gate line SGS. In this case, VreadL may be applied not only to the adjacent word line WL31 but also to the two word lines WL30 and WL31.

Furthermore, when a read pass voltage VreadL is applied to the non-selected word line WL31 which is adjacent to the drain side selection gate line SGD, it is sufficient if the drain side selection gate line SGD is charged after the source side selection gate line SGS has been charged. It is possible to optionally change the charge order of other lines.

As explained above, according to the nonvolatile semiconductor memory device 100 relating to embodiment two, the non-selected word line WL31 receives a coupling noise with charging of the drain side selection gate line SGD and the overshoot voltage peak value is reduced. By this, it becomes possible to prevent a read disturb of the memory cell MC31 which is connected to the non-selected word line WL31. Also, because it is possible to hasten the charge speed of a selection gate line, it becomes possible to improve the data read speed of a memory cell.

Embodiment Three

Figure 9:
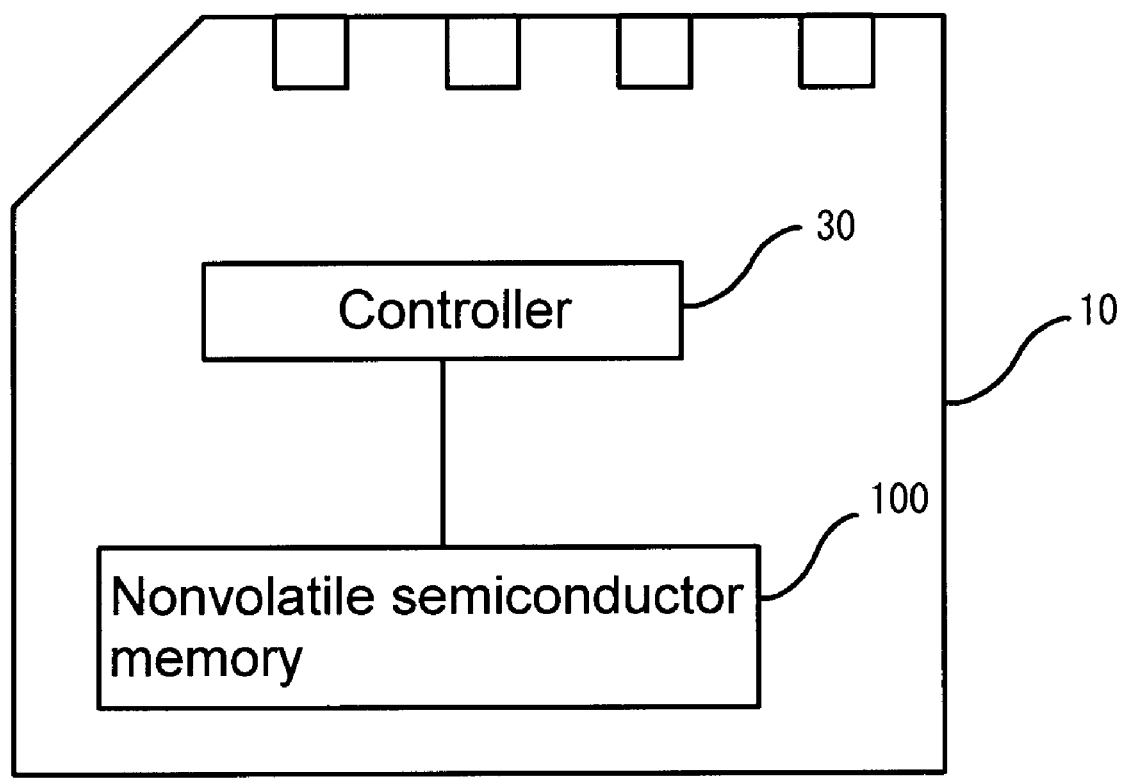
FIG. 9 is a block diagram which shows the composition of a memory card which is mounted on a nonvolatile semiconductor device relating to embodiment three of the present invention.

The present invention is not limited to the embodiments cited above and can be changed in various ways. For example, it is possible to mount a memory card 19 in the nonvolatile semiconductor memory 100 relating to embodiment one and embodiment two, as is shown in FIG. 9. That is, it is possible to construct a memory card 10 by mounting the nonvolatile semiconductor memory 100 and a controller 30 which controls this nonvolatile semiconductor memory 100.

Further, according to one embodiment of the present invention, a nonvolatile semiconductor memory is proposed including a memory cell array which has a plurality of NAND cell units which are arranged with the plurality of memory cells connected in series, a first selection transistor and a second selection transistor which are connected to both ends of the plurality of memory cells respectively, wherein a plurality of word lines and a plurality of bit line which are connected to the plurality of memory cells, when reading the data of a first group of memory cells which are on the side near to the first selection transistor and a second group of memory cells which are on the far side from the first selection transistor at different times, controlling in a different order the level of the voltage which is applied to each control gate of the first selection transistor and the second selection transistor, applying a read pass voltage to a non-selected memory cell other than the first group of memory cells or the second group of memory cells and when applying this read pass voltage, the read pass voltage which is applied to the word line which is connected to at least one nonselective memory cell which adjoins the first selection transistor or the second selection transistor is reduced lower than the read pass voltage which is applied to the word line which is connected to another non-selective memory cell.

In this way, a non-selected word line which is adjacent to a selection gate line receives a coupling noise with charging of selection gate line and the overshoot voltage peak value is reduced. By this, it becomes possible to prevent a read disturb of a memory cell which is connected to the non-selected word line. Also, because it is possible to hasten the charge timing of a selection gate line, it becomes possible to improve the data read speed of a memory cell.

What is claimed is:

1. A nonvolatile semiconductor memory comprising:
a memory cell array having a plurality of NAND cell units which are arranged with a plurality of memory cells connected in series and a drain side selection transistor and a source side selection transistor which are connected to both ends of said plurality of memory cells respectively;
a plurality of word lines which are connected to said plurality of memory cells and a plurality of bit lines which are connected to said plurality of NAND cell units; and
a data read control part wherein when at least one of said plurality of memory cells is selected and data is read from the selected memory cell, a first voltage is applied to a control gate of said source side selection transistor, a second voltage is applied to a selected bit line, a ground voltage is applied to a plurality of non-selected bit lines and a common source line, when said first voltage is applied to said control gate of said source side selection transistor a voltage which is applied to said plurality of word lines is 0 volts, predetermined voltages are applied to said plurality of word lines after said first voltage is applied to said control gate of said source side selection transistor, and a third voltage is applied to a control gate of said drain side selection transistor after said predetermined voltages are applied to said plurality of word lines, and when reading of said selected memory cell coupled to a selected word line, a read pass voltage which is applied to at least one of said plurality of word lines which is connected to a non-selected one of the plurality of memory cells which is adjacent to said drain side selection transistor, is made lower than a read pass voltage which is applied to other word lines of said plurality of word lines which are connected to other non-selected memory cells of the plurality of memory cells.

2. A method for reading a nonvolatile semiconductor memory comprising:
arranging a memory cell array having a plurality of NAND memory cell units, one of said NAND memory cell units including a plurality of memory cells connected in series, a drain side selection transistor and a source side selection transistor which are connected to both ends of said plurality of memory cells respectively, and a plurality of word lines which are connected to said plurality of memory cells, and a plurality of bit lines which are connected to said plurality of NAND memory cell units;
when selecting at least one of said plurality of memory cells and reading data of the selected memory cell, applying a first voltage to a control gate of said source side selection transistor, applying a second voltage to a selected bit line, applying a ground voltage to a plurality of non-selected bit lines and a common source line, when applying said first voltage to said control gate of said source selection transistor applying 0 volts of voltage to said plurality of word lines, applying predetermined voltages to said word lines after applying said first voltage to said control gate of said source side selection transistor, and applying a third voltage to a control gate of said drain side selection transistor after applying said predetermined voltages to said plurality of word lines; and
making a read pass voltage which is applied to at least one of said plurality of word lines which is connected to a non-selected one of the plurality of memory cells which is adjacent to said drain side selection transistor, lower than a read pass voltage which is applied to other word lines of said plurality of word lines which are connected to other non-selected memory cells of the plurality of memory cells when reading of said selected memory cell coupled to a selected word line.

3. A memory card mounting a nonvolatile semiconductor memory according to claim 1.

4. A nonvolatile semiconductor memory comprising:
a memory cell array having a plurality of NAND cell units which are arranged with a plurality of memory cells connected in series and a drain side selection transistor and a source side selection transistor which are each connected to both ends of said plurality of memory cells respectively;
a plurality of word lines which are connected to said plurality of memory cells and a plurality of bit lines which are connected to said plurality of NAND cell units; and
a data read control part wherein when at least one of said plurality of memory cells is selected and data is read from the selected memory cell, a first voltage is applied to a control gate of said drain side selection transistor, a second voltage is applied to a selected bit line, a ground voltage is applied to a plurality of non-selected bit lines and a common source line, when said first voltage is applied to said control gate of said drain side selection transistor a voltage which is applied to said plurality of word lines is 0 volts, predetermined voltages are applied to said plurality of word lines after said first voltage is applied to said control gate of said drain side selection transistor, and a third voltage is applied to a control gate of said source side selection transistor after said predetermined voltages are applied to said plurality of word lines, and when reading of said memory cell coupled to a selected word line, a read pass voltage which is applied to at least one of said plurality of word lines which is connected to a non-selected one of the plurality of memory cells which is adjacent to said source side selection transistor, is made lower than a read pass voltage which is applied to other word lines of said plurality of word lines which are connected to other non-selected memory cells of the plurality of memory cells.

5. A method for reading a nonvolatile semiconductor memory comprising:
arranging a memory cell array having a plurality of a NAND memory cell units, one of said NAND memory cell units including a plurality of memory cells connected in series, a drain side selection transistor and a source side selection transistor which are each connected to both ends of said plurality of memory cells respectively, and a plurality of word lines which are connected to said plurality of memory cells, and a plurality of bit lines which are connected to said plurality of NAND memory cell units;
when selecting at least one of said plurality of memory cells and reading data of the selected memory cell, applying a first voltage to a control gate of said drain side selection transistor, applying a second voltage to a selected bit line, applying a ground voltage to a plurality of non-selected bit lines and a common source line, when applying said first voltage to said control gate of said drain side selection transistor applying 0volts of voltage to said plurality of word lines, applying predetermined voltages to said word lines after applying said first voltage to said control gate of said drain side selection transistor, and applying a third voltage to a control gate of said source side selection transistor after applying said predetermined voltages to said plurality of word lines; and making a read pass voltage which is applied to at least one of said plurality of word lines which is connected to a non-selected one of the plurality of memory cells which is adjacent to said source side selection transistor, lower than a read pass voltage which is applied to other word lines of said plurality of word lines which are connected to other non-selected memory cells of the plurality of memory cells when reading of said selected memory cell coupled to a selected word line.

6. A memory card mounting a nonvolatile semiconductor memory according to claim 4.

* * * * *